(12) United States Patent
Park et al.

(10) Patent No.: US 11,097,320 B2
(45) Date of Patent: Aug. 24, 2021

(54) FOUP CLEANING DEVICE AND FOUP CLEANING METHOD

(71) Applicant: STI CO., LTD., Anseong-si (KR)

(72) Inventors: Young Soo Park, Anseong-si (KR); Oh Hyeong Kweon, Anseong-si (KR); Dong Keun Jung, Anseong-si (KR); Dong Geun Hur, Anseong-si (KR)

(73) Assignee: STI CO., LTD., Anseong-si (KR)

( * ) Notice: Subject to any disclaimer, the term of this patent is extended or adjusted under 35 U.S.C. 154(b) by 0 days.

(21) Appl. No.: 16/270,953

(22) Filed: Feb. 8, 2019

(65) Prior Publication Data
US 2019/0247900 A1 Aug. 15, 2019

(30) Foreign Application Priority Data

Feb. 9, 2018 (KR) .................. 10-2018-0016586

(51) Int. Cl.
| | | |
|---|---|---|
| *B08B 9/08* | (2006.01) | |
| *B08B 9/20* | (2006.01) | |
| *H01L 21/673* | (2006.01) | |
| *H01L 21/67* | (2006.01) | |
| *H01L 21/677* | (2006.01) | |

(Continued)

(52) U.S. Cl.
CPC .............. *B08B 9/0861* (2013.01); *B08B 3/10* (2013.01); *B08B 5/04* (2013.01); *B08B 9/0826* (2013.01); *B08B 9/205* (2013.01); *H01L 21/67028* (2013.01); *H01L 21/67034* (2013.01); *H01L 21/67051* (2013.01); *H01L 21/67389* (2013.01); *H01L 21/67769* (2013.01); *B08B 2203/007* (2013.01); *B08B 2209/08* (2013.01); *B08B 2230/01* (2013.01)

(58) Field of Classification Search
CPC ......... H01L 21/67028; H01L 21/67034; H01L 21/67051; H01L 21/67389; H01L 21/67769; H01L 21/02041; H01L 21/67742; H01L 21/67745; B08B 2203/007; B08B 2209/08; B08B 2230/01; B08B 3/10; B08B 5/04; B08B 9/0826; B08B 9/0861; B08B 9/0936; B08B 9/205; B08B 9/093
See application file for complete search history.

(56) References Cited

FOREIGN PATENT DOCUMENTS

| CN | 1938818 A | 3/2007 |
|---|---|---|
| CN | 102804332 A | 11/2012 |

(Continued)

OTHER PUBLICATIONS

Machine translation of KR10-1265182B1 (Year: 2013).*
Machine translation of KR10-1330990B1 (Year: 2013).*
Abstract of KR2014-0084511A (Year: 2014).*

*Primary Examiner* — Douglas Lee
(74) *Attorney, Agent, or Firm* — Stein IP, LLC

(57) ABSTRACT

An embodiment of the present subject matter including a FOUP body and a FOUP cover includes: a loading and unloading part configured to load or unload the FOUP; a standby part which is provided at one side of the loading and unloading part and on which the FOUP body and the FOUP cover are separated from or coupled to each other; a cleaning chamber configured to clean the FOUP body and the FOUP cover using steam; and a robot configured to transport the FOUP body and the FOUP cover between the standby part and the cleaning chamber.

22 Claims, 9 Drawing Sheets

(51) Int. Cl.
*B08B 3/10* (2006.01)
*B08B 5/04* (2006.01)

(56) References Cited

FOREIGN PATENT DOCUMENTS

| | | | |
|---|---|---|---|
| KR | 10-1173987 B1 | | 8/2012 |
| KR | 101265182 B1 | * | 5/2013 |
| KR | 10-2013-0095028 A | | 8/2013 |
| KR | 101330990 B1 | * | 11/2013 |
| KR | 20140084511 A | * | 7/2014 |
| KR | 10-2015-0078657 A | | 7/2015 |

* cited by examiner

FOUP CLEANING DEVICE AND FOUP CLEANING METHOD

CROSS-REFERENCE TO RELATED APPLICATION

This application claims priority to and the benefit of Korean Patent Application No. 10-2018-0016586, filed on Feb. 9, 2018, the disclosure of which is incorporated herein by reference in its entirety.

BACKGROUND

1. Field of the Invention

The present invention relates to a front opening unified pod (FOUP) cleaning device and a FOUP cleaning method, and more specifically, to a FOUP cleaning device capable of improving cleaning and drying efficiency for a FOUP used for storing and transporting substrates, and a FOUP cleaning method.

2. Discussion of Related Art

In a semiconductor manufacturing process, semiconductor substrates are processed by a series of manufacturing apparatuses which process the semiconductor substrates in various methods. When the semiconductor substrates are stored and transported, care should be taken that the semiconductor substrates are not damaged from external impacts, and surfaces of the substrates should be managed so as to not be contaminated with foreign matter such as moisture, particles, various organic matter, and the like.

Accordingly, when the semiconductor substrates are stored and transported, a separate storage container (front opening unified pod (FOUP)) is used.

Since a high-precision semiconductor substrate is stored in the FOUP used as described above, the FOUP needs to be managed to have high cleanliness, and to this end, the FOUP is periodically cleaned and dried by a FOUP cleaning device.

Prior arts relating to cleaning and drying for FOUPs are disclosed in Korean Patent Laid-Open No. 10-2013-0095028 and Korean Patent No. 10-1173987. In cases of the prior arts, surfaces of FOUPs are sprayed with cleaning liquids to clean the FOUPs. In the case in which the surface of the FOUP is sprayed with the cleaning liquid, since capability of liquefied water particles to permeate the surface of the FOUP is reduced, there are problems in that cleaning efficiency is low and it takes a long time to dry the FOUP which is cleaned.

In addition, as disclosed in Korean Patent Laid-Open No. 10-2015-0078657, a snorkel nozzle formed of a foamed porous material for purging an inside of a FOUP, in which a substrate is stored, is disposed in the FOUP, and when the FOUP is cleaned using a cleaning liquid, there are problems in that it takes a longer time to dry the snorkel nozzle and restore an original performance thereof, and the FOUP may not be used for a time for which the snorkel nozzle is dried so that process loss occurs.

SUMMARY OF THE INVENTION

The present invention is directed to providing a front opening unified pod (FOUP) cleaning device capable of improving cleaning and drying efficiency for a FOUP body and a FOUP cover, and a FOUP cleaning method.

According to an aspect of the present invention, there is provided a FOUP cleaning device for cleaning a FOUP including a FOUP body and a FOUP cover, and the FOUP cleaning device includes: a loading and unloading part configured to load or unload the FOUP; a standby part which is provided at one side of the loading and unloading part and on which the FOUP body and the FOUP cover are separated from or coupled to each other; a cleaning chamber configured to clean the FOUP body and the FOUP cover using steam; and a robot configured to transport the FOUP body and the FOUP cover between the standby part and the cleaning chamber.

The steam may be mixed with compressed dry air.

The cleaning chamber may include an external cleaning fluid spray part configured to spray a cleaning fluid onto an outer surface of the FOUP body and the FOUP cover and include an internal cleaning fluid spray part configured to spray a cleaning fluid onto an inner surface of the FOUP body.

The cleaning fluid sprayed by the external cleaning fluid spray part may be hot deionized water, and the cleaning fluid sprayed by the internal cleaning fluid spray part may be the steam.

The hot deionized water and the steam may be mixed with compressed dry air.

Hot deionized water or the steam may be selectively supplied through the external cleaning fluid spray part and the internal cleaning fluid spray part, and the hot deionized water and the steam may be mixed with compressed dry air.

A plurality of nozzles configured to spray a cleaning fluid and vertically separated may be formed in the external cleaning fluid spray part, wherein the plurality of nozzles may be formed to have different lengths and different spray angles to be positioned close to the outer surface of the FOUP body.

The FOUP body may be rotatably provided in the cleaning chamber, and the plurality of nozzles may be obliquely formed to spray the cleaning fluid in a direction opposite to a direction in which the FOUP body rotates.

The cleaning chamber may include an air supply part configured to spray compressed dry air to dry the FOUP body and the FOUP cover on which cleaning is performed.

The air supply part may include an external air supply part configured to spray the compressed dry air onto an outer surface of the FOUP body and include an internal air supply part configured to spray the compressed dry air onto an inner surface of the FOUP body.

A plurality of nozzles configured to spray the compressed dry air and vertically separated may be formed in the external air supply part, wherein the plurality of nozzles may be formed to have different lengths and different spray angles to be positioned close to the outer surface of the FOUP body.

The FOUP body may be rotatably provided in the cleaning chamber, and the plurality of nozzles may be obliquely formed to spray the compressed dry air in a direction opposite to a direction in which the FOUP body rotates.

The air supply part may further include an upper air supply part positioned between the FOUP body and the FOUP cover in the cleaning chamber and configured to spray the compressed dry air onto the FOUP body and the FOUP cover which are cleaned.

The FOUP body may include a snorkel nozzle formed of a foamed porous material configured to purge an inside of the FOUP body, and the cleaning chamber may include a compressed dry air supply part configured to inject compressed dry air into the snorkel nozzle after the FOUP body is cleaned.

The compressed dry air supply part may be provided to be movable forward or backward to be connected to or disconnected from one side end of the snorkel nozzle.

The cleaning chamber may include a stopper provided to be movable forward or backward and configured to support one side surface of the FOUP body such that the FOUP body is not pushed and moved to one side by the compressed dry air sprayed by the compressed dry air supply part.

The cleaning chamber may include a cleaning chamber body in which the FOUP body is accommodated and cleaned and include a cleaning chamber cover which is configured to open or close an upper portion of the cleaning chamber body and in which the FOUP cover is supportedly cleaned.

The cleaning chamber body may include a seating part provided at a lower portion of the cleaning chamber body to seat the FOUP body thereon and a lifting part vertically moved between the upper portion and the lower portion of the cleaning chamber body and configured to put the FOUP body onto the seating part or to receive the FOUP body from the seating part to vertically move the FOUP body, the lifting part may be connected to the cleaning chamber cover through a supporting part, and both the lifting part and the cleaning chamber cover may be vertically moved by one lifting driving part.

The cleaning chamber may include ultraviolet lamps configured to emit ultraviolet rays which dry the FOUP body and the FOUP which are cleaned.

The ultraviolet lamps may include an external ultraviolet lamp configured to emit the ultraviolet rays onto an outer surface of the FOUP body and include an internal ultraviolet lamp configured to emit the ultraviolet rays onto an inner surface of the FOUP body.

The FOUP cleaning device may further include a vacuum chamber into which the FOUP body and the FOUP cover, which are cleaned in the cleaning chamber, are transported by the robot, wherein the vacuum chamber may be connected to a nitrogen gas supply line configured to supply nitrogen gas into the vacuum chamber and a vacuum line configured to suction a fluid in the vacuum chamber to discharge the fluid to an outside.

The FOUP body may include a snorkel nozzle formed of a foamed porous material configured to purge an inside of the FOUP body, and the vacuum chamber may include a nitrogen gas supply part configured to inject nitrogen gas into the snorkel nozzle.

The nitrogen gas supply part may be provided to be movable forward or backward to be connected to or disconnected from one side end of the snorkel nozzle.

The vacuum chamber may include a stopper provided to be movable forward or backward and configured to support one side surface of the FOUP body such that the FOUP body is not pushed and moved to one side by the nitrogen gas sprayed by the nitrogen gas supply part.

The vacuum chamber may include a vacuum chamber body, in which the FOUP body and the FOUP cover are accommodated in a state in which the FOUP body and the FOUP cover are separated, and a vacuum chamber cover configured to vertically or laterally to open or close an opening formed in one side surface of the vacuum chamber body.

The FOUP cleaning device may further include a buffer in which the FOUP body, in which the snorkel nozzle is dried, and the FOUP cover, which is dried in the vacuum chamber, are temporarily stored before being transported to the standby part by the robot.

According to an aspect of the present invention, there is provided a FOUP cleaning method for cleaning a FOUP including a FOUP body and a FOUP cover, the FOUP cleaning method including: loading the FOUP on a loading and unloading part; transporting the loaded FOUP to a standby part; transporting the FOUP body and the FOUP cover transported to the standby part to a cleaning chamber using a robot; and cleaning the FOUP body and the FOUP cover by supplying steam into the cleaning chamber.

In the cleaning of the FOUP body and the FOUP cover, the steam may be mixed with compressed dry air and supplied into the cleaning chamber.

In the cleaning of the FOUP body and the FOUP cover, hot deionized water may be supplied to an outer surface of the FOUP body and the FOUP cover, and the steam may be supplied to an inner surface of the FOUP body.

The hot deionized water and the steam may be mixed with compressed dry air and supplied.

The FOUP cleaning method may further include, when the cleaning of the FOUP body and the FOUP cover is performed, drying the FOUP body and the FOUP cover by spraying compressed dry air onto the FOUP body and the FOUP cover.

The drying of the FOUP body and the FOUP cover may include drying a snorkel nozzle included in the FOUP body by injecting the compressed dry air into the snorkel nozzle.

The FOUP cleaning method may further include, when the drying of the FOUP body and the FOUP cover is performed, transporting the FOUP body and the FOUP cover into a vacuum chamber using the robot and discharging foreign matter containing moisture remaining on the FOUP body and the FOUP cover by supplying nitrogen gas and suctioning the foreign matter by vacuum.

The FOUP cleaning method may further include drying the snorkel nozzle by injecting nitrogen gas into the snorkel nozzle.

The FOUP cleaning method may further include, when the drying of the snorkel nozzle is performed, temporarily storing the FOUP body and the FOUP cover on a buffer, sequentially transporting the FOUP body and the FOUP cover to the standby part and the loading and unloading part, and unloading the FOUP.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Hereinafter, configurations and operations according to exemplary embodiments of the present invention will be described in detail with reference to the accompanying drawings.

Figure 1:
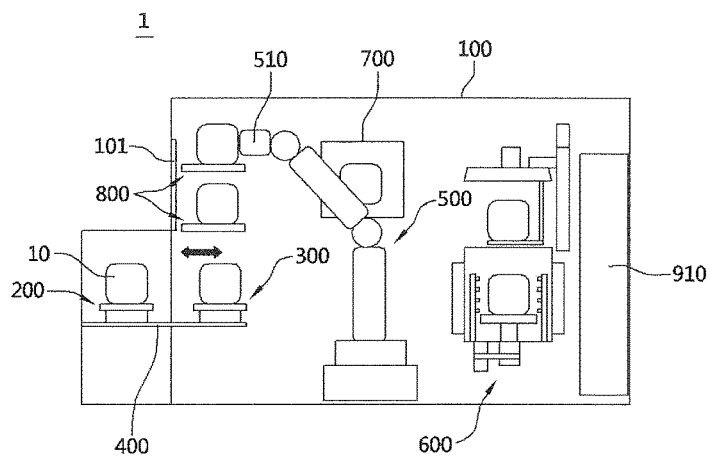
FIG. 1 is a schematic side view illustrating a configuration of a front opening unified pod (FOUP) cleaning device according to the present invention.
Figure 2:
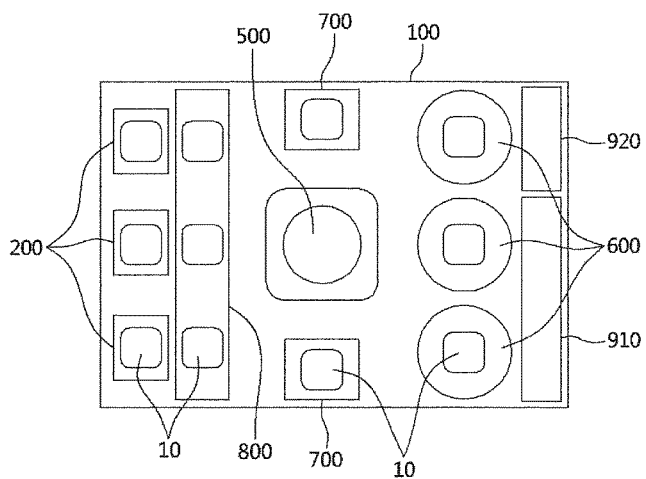
FIG. 2 is a schematic plan view illustrating the configuration of the FOUP cleaning device according to the present invention.

Referring to FIGS. 1 and 2, a front opening unified pod (FOUP) cleaning device 1 according to the present invention is a device configured to clean and dry FOUPs 10, which are used for storing and transporting a semiconductor substrate. The FOUP 10 includes a FOUP body 20 in which the semiconductor substrates (not shown) are stored, and a FOUP cover 30 configured to open or close openings formed at one sides of the FOUP body 20, and the FOUP body 20 and the FOUP cover 30 are separated or coupled by lockers (not shown).

The FOUP cleaning device 1 includes a processing room 100 in which the FOUP 10 is transported, cleaned, and dried, a loading and unloading part 200 configured to put or take the FOUP 10 into or out of the processing room 100, a standby part 300 which is provided at one side of the loading and unloading part 200 in the processing room 100 and in which the FOUP body 20 is separated from or coupled to the FOUP cover 30, a transportation unit 400 configured to transport the FOUP 10 between the loading and unloading part 200 and the standby part 300, a robot 500 configured to grip and transport the FOUP body 20 and the FOUP cover 30 in the processing room 100, a cleaning chamber 600 configured to receive the FOUP body 20 and the FOUP cover 30 positioned on the standby part 300 from the robot 500 to clean the FOUP body 20 and the FOUP cover 30 using steam and dry the FOUP body 20 and the FOUP cover 30, a vacuum chamber 700 configured to receive the FOUP body 20 and the FOUP cover 30 cleaned and dried in the cleaning chamber 600 from the robot 500 and to discharge foreign matter containing moisture remaining at the FOUP body 20 and the FOUP cover 30, and a buffer 800 configured to temporarily store the FOUP body 20 which is ventilated in the vacuum chamber 700 and the FOUP cover 30 before the FOUP body 20 and the FOUP cover 30 are transported to the standby part 300. In addition, a utility 910 including apparatuses for supplying hot deionized water, compressed dry air (CDA), nitrogen gas ($N_2$), and the like used for cleaning and drying the FOUP 10, and a steam unit 920 including apparatuses for supplying steam for cleaning the FOUP 10 may be provided at one side in the processing room 100.

Figure 3:
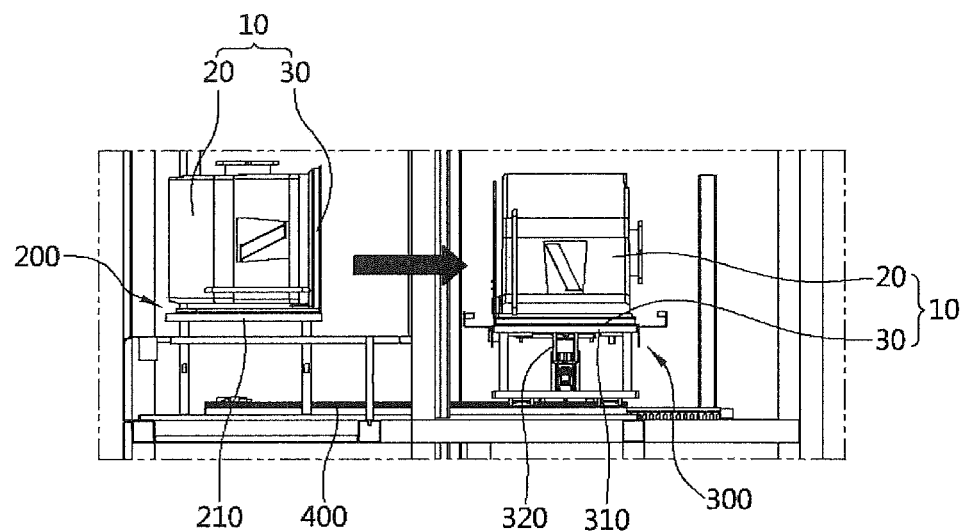
FIG. 3 is a view for describing a process in which a FOUP is transported from a loading and unloading part to a standby part in the FOUP cleaning device according to the present invention.

The loading and unloading part 200 is a part configured to load the cleaning target FOUP 10 so as to put the cleaning target FOUP 10 into the processing room 100 or to take the FOUP 10, which is cleaned, dried, and ventilated in the processing room 100, out of the processing room 100 to the outside. Referring to FIG. 3, a supporting plate 210, on which the FOUP body 20 is seated in a state in which the FOUP body 20 is laid on its side and the FOUP cover 30 is positioned at one side, is provided in the loading and unloading part 200.

The standby part 300 is a part in which the FOUP 10 transported from the loading and unloading part 200 by the transportation unit 400 stands by before being transported to the cleaning chamber 600, and an orientation of the FOUP 10 transported to the standby part 300 is changed by the robot 500 to a direction in which the FOUP cover 30 faces downward. In addition, the standby part 300 includes a locking and unlocking unit (not shown) configured to lock or unlock the locker provided for the FOUP body 20 and the FOUP cover 30. The locking and unlocking unit may rotate the locker in one direction or the other direction to lock or unlock the locker.

The standby part 300 includes a standby plate 310 on which the FOUP body 20 and the FOUP cover 30 are seated, and a lifting cylinder 320 configured to vertically move the standby plate 310. The lifting cylinder 320 may be connected to the transportation unit 400 and may reciprocate between the loading and unloading part 200 and the standby part 300 by driving of the transportation unit 400.

The transportation unit 400 is a unit for allowing the lifting cylinder 320 to reciprocate and may include a linear motion guide.

A process in which the FOUP 10 is transported from the loading and unloading part 200 to the standby part 300 will be described. When the FOUP 10 is loaded on the supporting plate 210, the lifting cylinder 320 which stands by under the supporting plate 210 moves upward to move the FOUP 10 placed on the supporting plate 210 upward from the supporting plate 210. In this state, the lifting cylinder 320 and the FOUP 10 are transported toward the standby part 300 by driving of the transportation unit 400. When the lifting cylinder 320 and the FOUP 10 are positioned above the standby plate 310 of the standby part 300, the lifting cylinder 320 moves downward and places the FOUP 10 supported by the lifting cylinder 320 on the standby plate 310. Next, a gripper 510 of the robot 500 grips the FOUP 10, rotates the FOUP 10 such that the FOUP cover 30 faces downward, and places the FOUP 10 on the standby plate 310, and the locker is unlocked by the locking and unlocking unit provided in the standby part 300 so that the FOUP body 20 and the FOUP cover 30 may be in a separable state.

As described above, when the FOUP body 20 and the FOUP cover 30 may be in the separable state, the FOUP body 20 and the FOUP cover 30 are sequentially transported to the cleaning chamber 600 by the robot 500.

Figure 4:
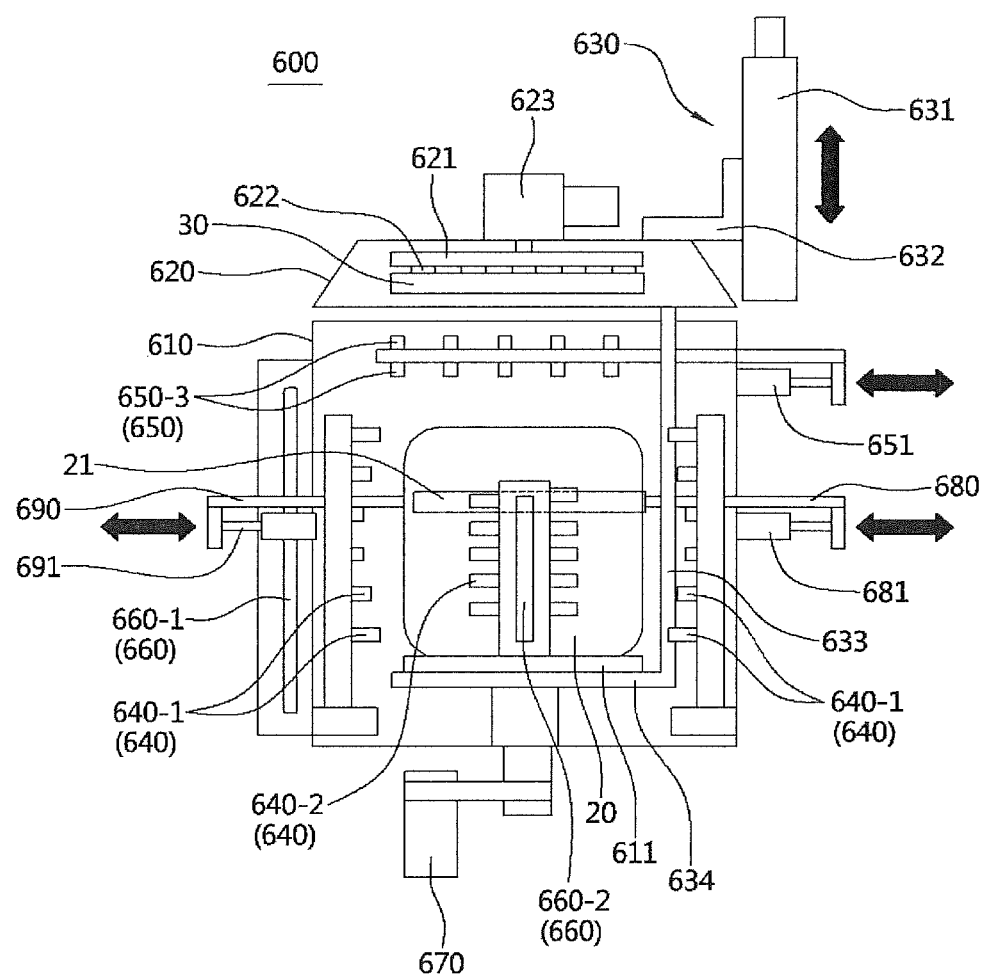
FIG. 4 is a schematic longitudinal section view illustrating a configuration of a cleaning chamber included in the FOUP cleaning device according to the present invention.
Figure 5:
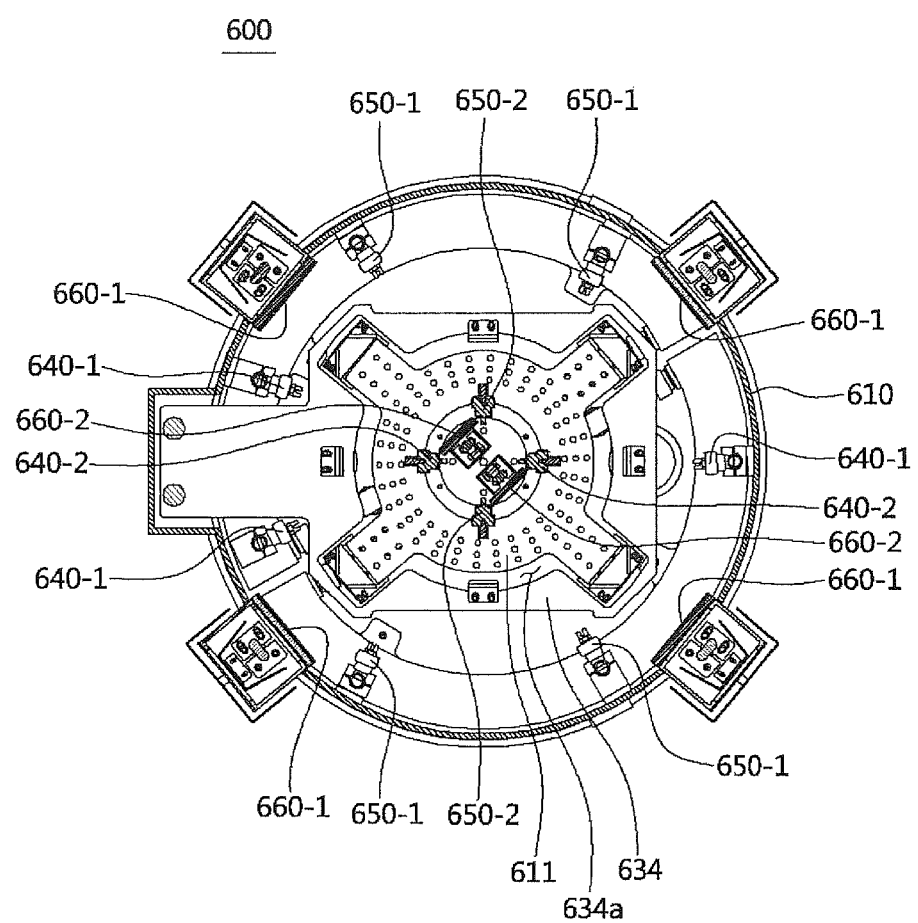
FIG. 5 is a cross-sectional view illustrating an internal structure of the cleaning chamber.

Referring to FIGS. 4 and 5, the cleaning chamber 600 includes a cleaning chamber body 610, in which the FOUP body 20 is accommodated, cleaned, and dried, and a cleaning chamber cover 620 which opens or closes an upper portion of the cleaning chamber body 610 and in which the FOUP cover 30 is supportedly cleaned and dried.

The cleaning chamber body 610 includes a seating part 611 provided at a lower portion in the cleaning chamber body 610 to seat the FOUP body 20 thereon and includes a lifting part 634 configured to move vertically between the upper portion and the lower portion in the cleaning chamber body 610 and transport the FOUP body 20 onto the seating part 611 or receive the FOUP body 20 from the seating part 611 to vertically move the FOUP body 20. The lifting part 634 is connected to the cleaning chamber cover 620 through a supporting part 633, and both of the lifting part 634 and the cleaning chamber cover 620 may be vertically moved by a lifting driving part 631.

In a case in which the FOUP body 20 and the FOUP cover 30 move from the standby part 300 to the cleaning chamber 600, the lifting driving part 631 moves upward, and accordingly, all of the cleaning chamber cover 620, the supporting part 633, and the lifting part 634 move upward so that the upper portion of the cleaning chamber body 610 is opened and the seating part 611 simultaneously moves to the upper portion in the cleaning chamber body 610 to stand by at a position at which the seating part 611 may receive the FOUP body 20.

The cleaning chamber cover 620 includes a FOUP cover supporting part 621 and a clamp 622 for supporting and fixing the FOUP cover 30 transported by the robot 500.

When the FOUP body 20 is transported onto the lifting part 634 by the robot 500 and when the FOUP cover 20 is fixedly supported on the cleaning chamber cover 620 by the FOUP cover supporting part 621 and the clamp 622, the cleaning chamber cover 620, the FOUP cover 30 fixed to the cleaning chamber cover 620, and the lifting part 634 connected to the cleaning chamber cover 620 through the supporting part 633 support the FOUP body 20 and are moved downward by downward driving of the lifting driving part 631. In this case, the lifting driving part 631 moves downward to a position at which the cleaning chamber cover 620 seals the upper portion of the cleaning chamber body 610, and in this process, the lifting part 634 transports the FOUP body 20 onto the seating part 611 and is positioned and stands by under the seating part 611.

Referring to FIG. 5, a through hole 634a is formed in a central portion of the lifting part 634, and the seating part 611 is positioned inside the through hole 634a. Accordingly, when the lifting part 634 moves vertically, the lifting part 634 is prevented from being interfered with by the seating part 611, and the FOUP body 20 may be transported between the lifting part 634 and the seating part 611.

Meanwhile, the cleaning chamber body 610 includes cleaning fluid spray parts 640 (640-1 and 640-2) configured to supply cleaning fluids for cleaning the FOUP body 20 and the FOUP cover 30.

The cleaning fluid spray parts 640 may include the external cleaning fluid spray parts 640-1 configured to spray the cleaning fluid onto an outer surface of the FOUP body 20 and the FOUP cover 30 and the internal cleaning fluid spray parts 640-2 configured to spray the cleaning fluid onto an inner surface of the FOUP body 20.

In the external cleaning fluid spray parts 640-1, a plurality of nozzles provided on an outer circumference of the FOUP body 20 and configured to simultaneously spray the cleaning fluid toward the outer surface of the FOUR body 20 and spray the cleaning fluid toward the FOUP cover 30 may be provided at positions vertically spaced apart from each other.

The internal cleaning fluid spray parts 640-2 are provided on the seating part 611 to be positioned inside the FOUP body 20 and spray the cleaning fluid toward the inner surface of the FOUP body 20.

Meanwhile, the seating part 611 on which the FOUP body 20 is seated is provided to be rotatable by driving of a motor 670, and the FOUP cover supporting part 621 by which the FOUP cover 20 is supported is provided to be rotatable by driving of the motor 623.

Referring to FIG. 4, in the external cleaning fluid spray parts 640-1, the plurality of nozzles configured to spray the cleaning fluid are formed to be vertically spaced apart from each other and may have different lengths and different spray angles so as to be positioned close to the outer surface of the FOUP body 20. In addition, the FOUP body 20 may be rotatably provided in the cleaning chamber 600, and the plurality of nozzles may be obliquely formed to spray the cleaning fluid in a direction opposite to a direction in which the FOUP body 20 rotates. Inclination angles of the nozzles may be in the range of 30° to 40° with respect to lines which connect centers of the nozzles and the FOUP body 20.

According to the above-described configuration, when the FOUP body 20 and the FOUP cover 30 are cleaned, since the external cleaning fluid spray parts 640-1 spray the cleaning fluid from positions close to the outer surface of the rotating FOUP body 20 in the direction opposite to the direction in which the FOUP body 20 rotates, cleaning efficiency for the FOUP body 20 can be improved.

Figure 6:
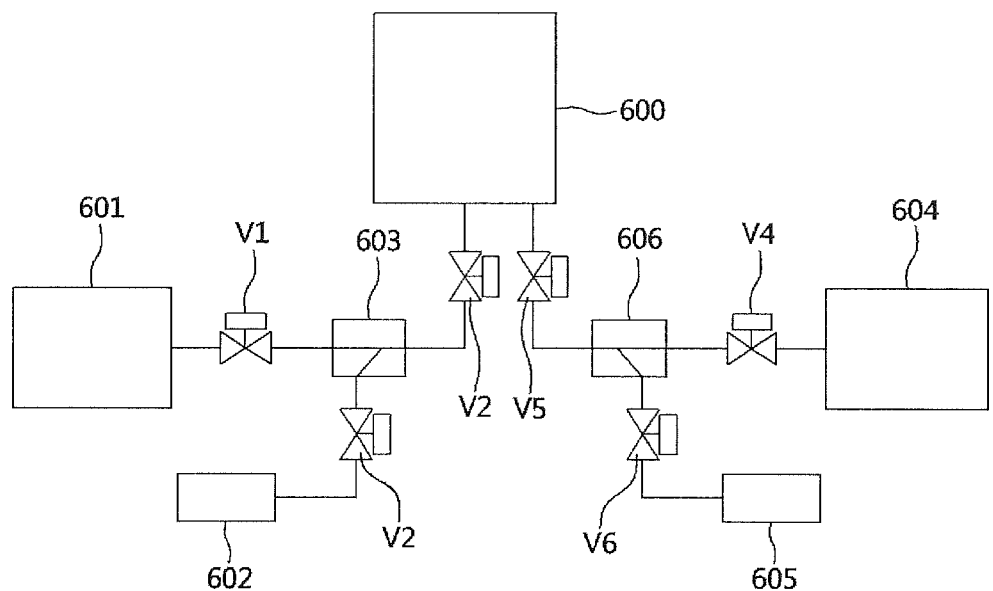
FIG. 6 is a systemic diagram in which a cleaning fluid is supplied to the cleaning chamber according to one embodiment.

Referring to FIG. 6, as an embodiment, a cleaning fluid sprayed by the external cleaning fluid spray parts 640-1 is hot deionized water, and a cleaning fluid sprayed by the internal cleaning fluid spray parts 640-2 may be steam. In addition, the hot deionized water and the steam may be mixed with CDA and supplied.

As a configuration to this end, the external cleaning fluid spray parts 640-1 of the cleaning chamber 600 are connected to a hot deionized water supply part 604, and a two-stream nozzle 606 configured to mix the CDA supplied from an air supply part 605 with the hot deionized water is provided on a connection line between the external cleaning fluid spray parts 640-1 and the hot deionized water supply part 604. In addition, a steam generator 601 is connected to the internal cleaning fluid spray parts 640-2 of the cleaning chamber 600, and a two-stream nozzle 603 configured to mix the CDA supplied from an air supply part 602 with the steam is provided on a connection line between the steam generator 601 and the internal cleaning fluid spray parts 640-2. Unexplained symbols V1 to V6 in FIG. 6 refer to valves configured to open or close corresponding supply lines.

Since the mixed fluid of the hot deionized water and the CDA are supplied to the external cleaning fluid spray parts 640-1 as described above, high temperature bubbles and particles of water can thoroughly permeate the outer surface of the FOUP body 20 and the FOUP cover 30 to improve detergency, reduce a drying time, and improve cleaning efficiency by increasing a spray pressure. In addition, since the mixed fluid of the steam and the CDA are supplied to the internal cleaning fluid spray parts 640-2, the steam particles, which are smaller than those of the hot deionized water, may more thoroughly permeate an entire region of the inner surface of the FOUP body 20 without blind spots to further improve detergency. In addition, according to the present embodiment, since the steam is only supplied to an inside of the FOUP body 20, cleaning efficiency for the inside of the FOUP body 20 can be improved as compared to when the steam is supplied to an entirety of the inside and the outside of the FOUP body 20 while a capacity and a volume of the steam generator 601 decreases.

Figure 7:
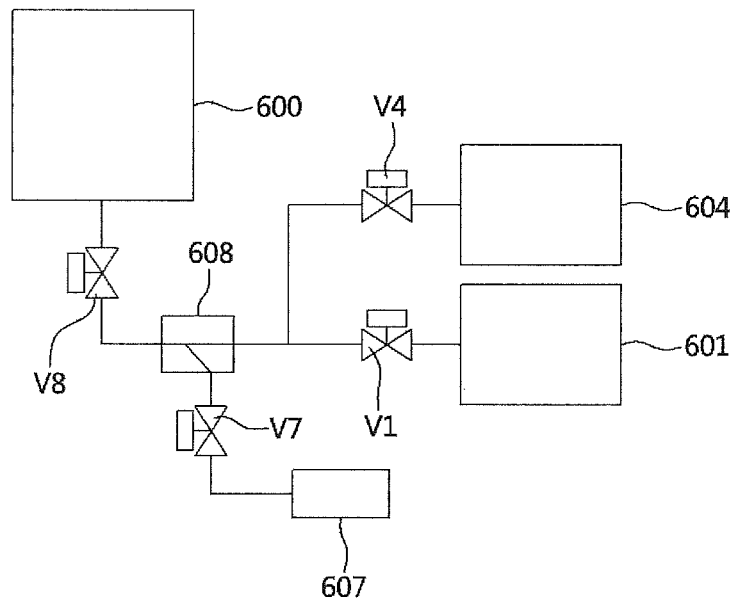
FIG. 7 is a systemic diagram in which a cleaning fluid is supplied to a cleaning chamber according to another embodiment.

Referring to FIG. 7, as another embodiment, hot deionized water and steam may be selectively supplied by the external cleaning fluid spray parts 640-1 and the internal cleaning fluid spray parts 640-2, and the hot deionized water and the steam may be mixed with CDA and supplied. As a configuration to this end, the external cleaning fluid spray parts 640-1 and the internal cleaning fluid spray parts 640-2 of the cleaning chamber 600 are connected to a single line in which a supply line connected to the hot deionized water supply part 604 and a supply line connected to the steam generator 601 are combined, and a two-stream nozzle 608 configured to mix the CDA supplied from an air supply part 607 is provided on the combined single line. Unexplained symbols V1, V4, V7, and V8 in FIG. 7 refer to valves configured to open or close corresponding supply lines.

According to the above-described configuration, since the hot deionized water and the steam are selectively supplied to the external cleaning fluid spray parts 640-1 and the internal cleaning fluid spray parts 640-2, the common cleaning fluid supply line and the two-stream nozzle 608 may be commonly used, and thus a structure of the apparatus can be simplified. And since the mixed fluid of the CDA is supplied to the supplied hot deionized water and the steam, particles of the cleaning fluids may be sprayed onto the FOUP body 20 and the FOUP cover 30 as in the above-described embodiment to improve cleaning efficiency.

Meanwhile, the cleaning chamber 600 includes air supply parts 650 configured to spray the CDA for drying the FOUP body 20 and the FOUP cover 30 which are cleaned.

The air supply parts 650 include external air supply parts 650-1 configured to spray the CDA onto the outer surface of the FOUP body 20, and internal air supply parts 650-2 configured to spray the CDA onto the inner surface of the FOUP body 20.

A plurality of nozzles, which are similar to those of the above-described external cleaning fluid spray parts 640-1, are configured to spray the CDA, are separated from each other, are formed at the external air supply parts 650-1, and have different lengths and different spray angles to be positioned close to the outer surface of the FOUP body 20. In addition, the plurality of nozzles are obliquely formed to spray the CDA in a direction opposite to a direction in which the FOUP body 20 rotates. Inclination angles of the nozzles may be in the range of 30° to 40° with respect to lines connecting centers of the nozzles and the FOUP body 20.

According to the above-described configuration, when the FOUP body 20 is dried, since the CDA is sprayed in the direction opposite to the direction in which the FOUP body 20 rotates from positions close to the outer surface of the FOUP body 20, drying efficiency for the FOUP body 20 and the FOUP cover 30 can be improved.

Meanwhile, the air supply parts 650 may further include upper air supply parts 650-3 positioned between the FOUP body 20 and the FOUP cover 30 in the cleaning chamber 600, provided to be moved forward or backward by driving of the cylinder 651, and configured to spray the CDA onto the FOUP body 20 and the FOUP cover 30 which are cleaned. Since the upper air supply parts 650-3 are provided to be movable forward or backward, as illustrated in FIG. 4, moisture which is stagnant on an upper surface of the FOUP body 20 seated in a direction in which the opening faces downward can be effectively dried and removed, and moisture remaining on an entire region of the FOUP cover 30 can be effectively dried and removed.

Meanwhile, a snorkel nozzle 21 formed of a foamed porous material configured to purge an inside of the FOUP body 20 is provided inside the FOUP body 20, and a CDA supply part 680 configured to inject the CDA into the snorkel nozzle 21 after the FOUP body 20 is cleaned is provided in the cleaning chamber 600. The CDA supply part 680 is provided to be movable forward or backward to be connected to or disconnected from one side end of the snorkel nozzle by driving of a cylinder 681. Accordingly, moisture which is not dried yet and remains at the snorkel nozzle 21 in the drying process performed by CDA spraying of the above-described air supply part 650 is redried by injection of the CDA into an inside of the snorkel nozzle 21 performed by the CDA supply part 680.

In addition, the cleaning chamber 600 includes a stopper 690 which is movable forward or backward by driving of the cylinder 691 so as to support one side surface of the FOUP body 20 such that the FOUP body 20 is not pushed and moved toward one side by the CDA sprayed from the CDA supply part 680.

When the cleaning is performed by the cleaning fluid supply parts 640 and the drying is performed by the air supply parts 650, the seating part 611 and the FOUP body 20 seated on an upper surface of the seating part 611 are rotated by driving of the motor 670, and the CDA supply part 680 and the stopper 690 are positioned to be separated from the outer surface of the FOUP body 20. In addition, when the snorkel nozzle 21 is dried by the CDA supply part 680, the motor 670 stops driving, the seating part 611 and the FOUP body 20 seated on the upper surface of the seating part 611 are not rotated and are positioned without moving at the position, and the CDA supply part 680 and the stopper 690 are positioned to be pressed against the outer surface of the FOUP body 20.

An end portion of the CDA supply part 680 and a connection port formed in the outer surface of the FOUP body 20 connected to an end portion of the snorkel nozzle 21 may be connected by a sealing unit, such as an O-ring, so that an air-tight state is maintained therebetween.

Meanwhile, ultraviolet lamps 660 configured emit ultraviolet rays for drying the FOUR body 20 and the FOUP cover 30 which are cleaned are provided in the cleaning chamber 600. The ultraviolet lamps 660 include external ultraviolet lamps 660-1 configured to emit the ultraviolet rays to the outer surface of the FOUP body 20 and internal ultraviolet lamps 660-2 configured to emit the ultraviolet rays to the inner surface of the FOUP body 20.

When cleaning and drying are performed in the cleaning chamber 600, the cleaning chamber cover 620 and the FOUP cover 30 supported by the cleaning chamber cover 620 are moved upward by driving of the lifting driving part 631, and the lifting part 634 connected to the cleaning chamber cover 620 by the supporting part 633 receives the FOUP body 20 seated on the seating part 611 while being simultaneously moved upward, moves to the upper portion of the cleaning chamber body 610, and is positioned in a state in which the FOUP body 20 is dischargeable.

Since both the cleaning chamber cover 620 and the lifting part 634 are vertically moved by driving of one lifting driving part 631 as described above, the FOUP body 20 and the FOUP cover 30 can be simply, quickly, and smoothly put into or taken out of the cleaning chamber 600.

When the FOUP body 20 is moved to the upper portion of the cleaning chamber body 610, the FOUP cover 30 and the FOUP body 20 are transported to the vacuum chamber 700 by the robot 500.

Figure 8:
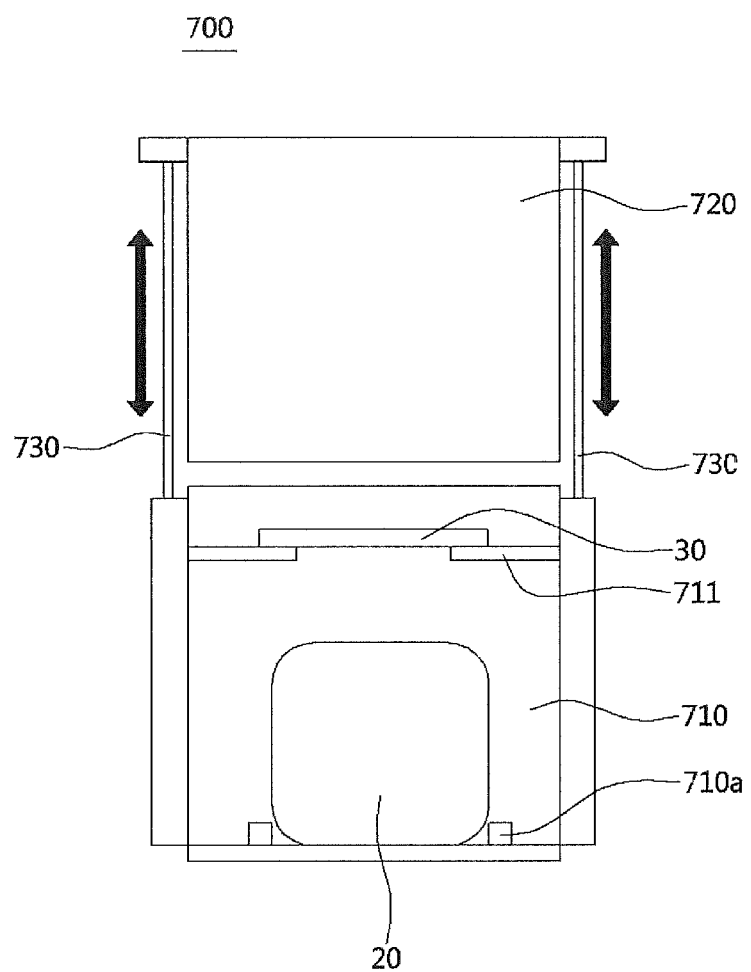
FIGS. 8 and 9 are schematic plan and side views respectively illustrating a configuration and an opening and closing structure of a vacuum chamber included in the FOUP cleaning device according to the present invention.
Figure 9:
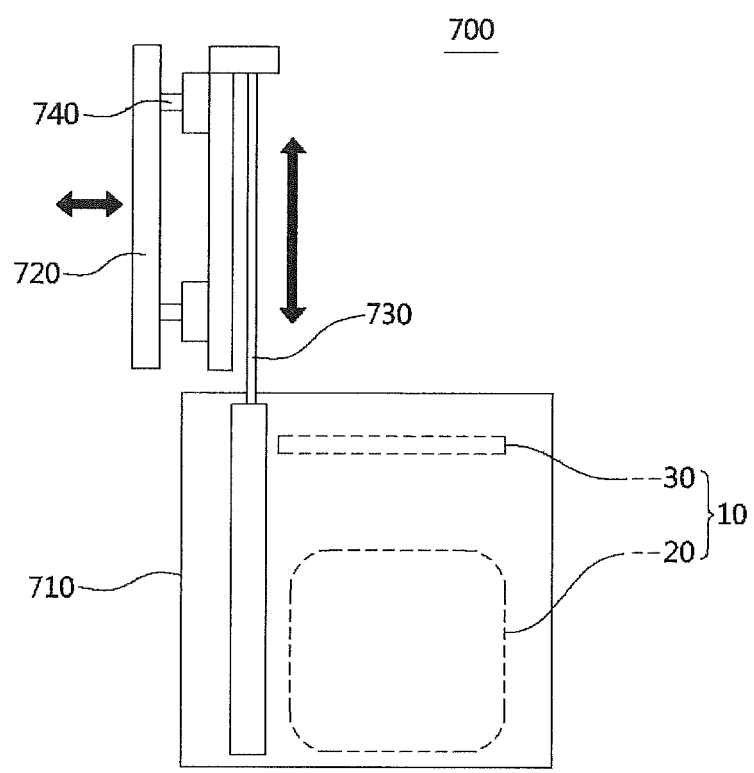
Figure 10:
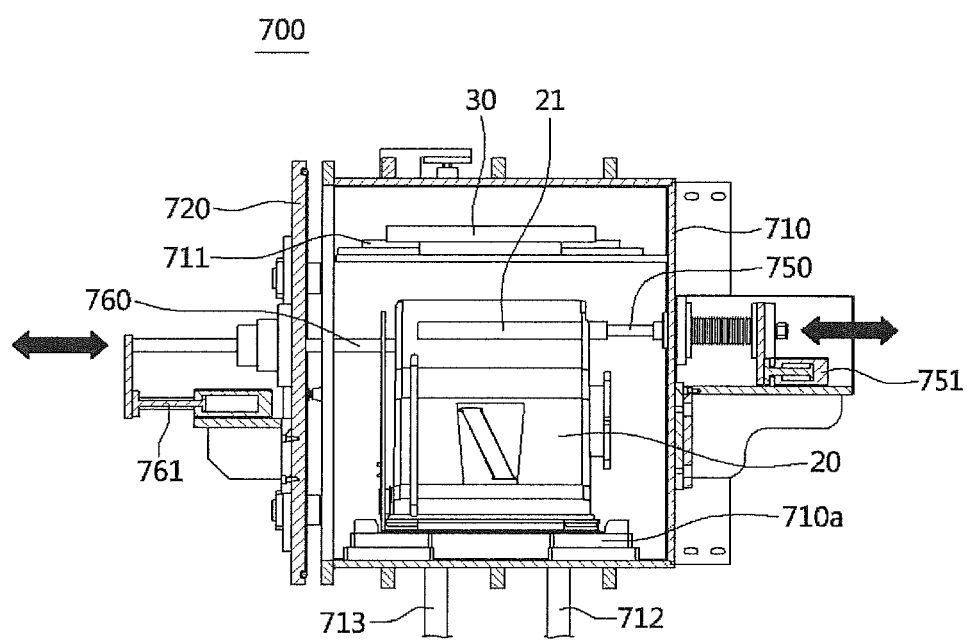
FIG. 10 is a longitudinal section view illustrating the vacuum chamber.

Referring to FIGS. 8 to 10, the vacuum chamber 700 includes a vacuum chamber body 710 in which the FOUP body 20 and the FOUP cover 30, which are separated, are accommodated, and a vacuum chamber cover 720 vertically or laterally moves to open or close an opening formed in one side surface of the vacuum chamber body 710. The FOUP body 20 is seated on a seating part 710a provided at a lower portion in the vacuum chamber body 710, and the FOUP cover 30 is seated on a supporting part 711 provided at an upper portion in the vacuum chamber body 710. The vacuum chamber cover 720 is vertically moved by driving of a lifting cylinder 730 and is moved forward or backward by driving of a forward and backward moving cylinder 740 to open or close the opening formed in one side surface of the vacuum chamber body 710.

Referring to FIG. 10, the vacuum chamber 700 is connected to a nitrogen gas supply line 713 configured to supply nitrogen gas to an inside of the vacuum chamber 700 and a vacuum line 712 to suction a fluid in the vacuum chamber 700 so as to discharge the fluid to the outside. Foreign matter including moisture remaining on the FOUP body 20 and the FOUP cover 30 is separated from the FOUP body 20 and the FOUP cover 30 by the nitrogen gas supplied through the nitrogen gas supply line 713, and are suctioned through the vacuum line 712 and discharged to the outside.

Meanwhile, a nitrogen gas supply part 750 configured to inject nitrogen gas into the snorkel nozzle 21 provided in the FOUP body 20 is provided in the vacuum chamber 700. The nitrogen gas supply part 750 is provided to be movable forward or backward by driving of a cylinder 751 to be connected to or disconnected from one side end of the snorkel nozzle 21.

Accordingly, moisture, which is not yet dried by the CDA supply part 680 of the cleaning chamber 600 and remains at the snorkel nozzle 21, may be dried and removed by the nitrogen gas injected through the nitrogen gas supply part 750 of the vacuum chamber 700.

In addition, a stopper 690 is provided in the vacuum chamber 700 to be movable forward or backward by driving of a cylinder 691 so as to support one side surface of the FOUP body 20 such that the FOUP body 20 is not pushed and moved toward one side by the nitrogen gas sprayed by the nitrogen gas supply part 750. An end portion of the nitrogen gas supply part 750 and the connection port formed in the outer surface of the FOUP body 20 connected to the end portion of the snorkel nozzle 21 may be connected by a sealing unit, such as an O-ring, so that an air-tight state is maintained therebetween.

When the moisture and foreign matter are discharged and the snorkel nozzle 21 is dried in the vacuum chamber 700, the vacuum chamber cover 720 is moved toward one side by driving of the forward and backward moving cylinder 740 to open the opening formed in one side surface of the vacuum chamber body 710 and is moved upward by driving of the lifting cylinder 730, and thus the FOUP body 20 and the FOUP cover 30 are allowed to be taken out of the vacuum chamber 700.

The FOUP body 20, in which the snorkel nozzle 21 is dried in the vacuum chamber 700, and the FOUP cover 30 are transported to the standby part 300 by the robot 500. In this case, when another FOUP is positioned at the standby part 300, the robot 500 may transport the FOUP body 20 and the FOUP cover 30 to the buffer 800 to temporarily store the FOUP body 20 and the FOUP cover 30 in the buffer 800.

Next, when the FOUP body 20 and the FOUP cover 30 previously placed on the standby part 300 are unloaded by the loading and unloading part 200, the FOUP cover 30 and the FOUP body 20 temporarily stored in the buffer 800 are sequentially transported onto the standby part 300 to seat the FOUP body 20 on the FOUP cover 30 such that the FOUP body 20 is lockable on the FOUP cover 30.

Next, the locker is locked by the locking and unlocking unit provided on the standby part 300 to integrally couple the FOUP body 20 and the FOUP cover 30.

A direction of the FOUR 10, in which the FOUP body 20 and the FOUP cover 30 are coupled by locking of the locker, is changed by the robot 500 such that the FOUP cover 30 is laid to face one side, and the FOUP 10 is seated on the standby plate 310 again. In addition, when the lifting cylinder 320 provided in the standby part 300 moves upward to move the FOUP 10 upward from the standby plate 310, the lifting cylinder 320 and the FOUP 10 supported by the lifting cylinder 320 are transported onto the supporting plate 210 of the loading and unloading part 200 by driving of the transportation unit 400, and the FOUP 10 supported by the lifting cylinder 320 is transported onto the supporting plate 210 and unloaded by downward movement of the lifting cylinder 320.

Figure 11:
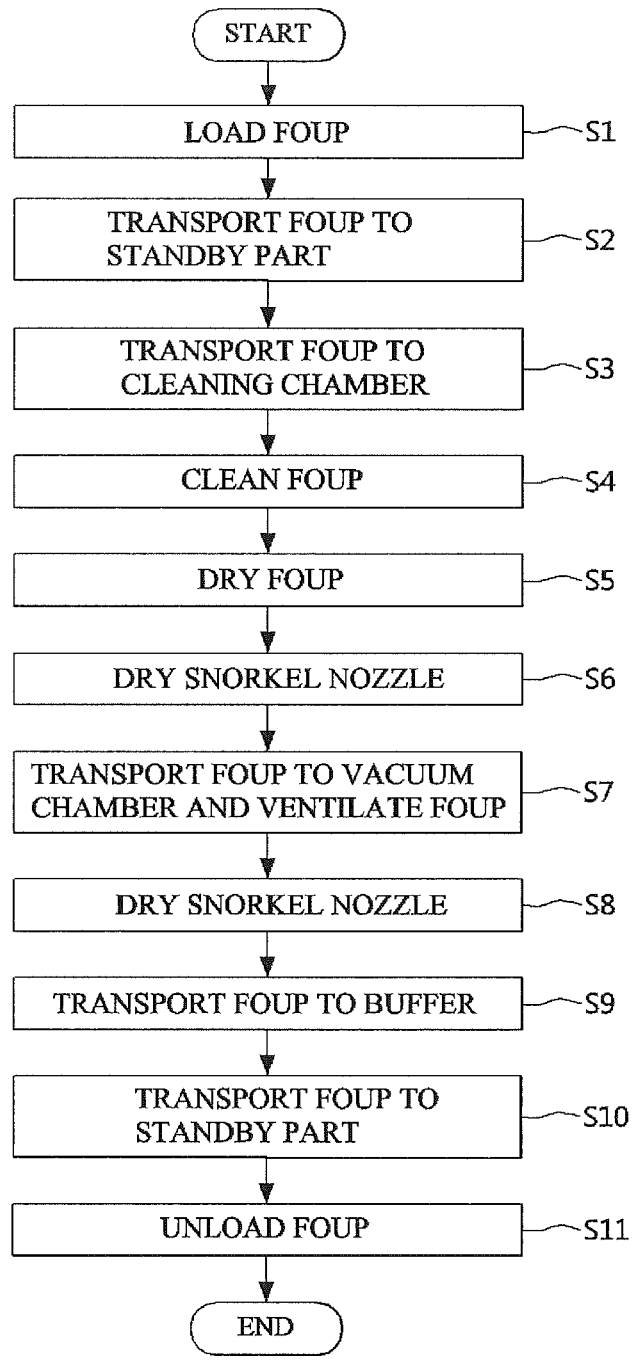
FIG. 11 is a flowchart illustrating a FOUP cleaning method according to the present invention.

Hereinafter, a FOUP cleaning method according to the present invention will be described with reference to FIG. 11, and detailed descriptions which are the same as those of the above-described FOUP cleaning device will be omitted.

First, the FOUP 10 is loaded on the loading and unloading part 200 (S1).

After the FOUP 10 is loaded on the loading and unloading part 200, the FOUP 10 is transported to the standby part 300 by the transportation unit 400 (S2). An orientation of the FOUP 10 transported to the standby part 300 is changed by the robot 500 to a direction in which the FOUP cover 30 faces downward, the FOUP 10 is seated on the standby plate 310, and the locker for the FOUP body 20 and the FOUP cover 30 is unlocked by the locking and unlocking unit.

Next, the FOUP body 20 and the FOUP cover 30 are sequentially transported into the cleaning chamber 600 by the robot 500 (S3). In this case, the cleaning chamber cover 620 of the cleaning chamber 600 is moved above the cleaning chamber body 610 by upward driving of the lifting driving part 631 and stands by, and the lifting part 634 connected to the cleaning chamber cover 620 through the supporting part 633 stands by at a position at which the lifting part 634 may receive the FOUP body 20 through the upper portion of the cleaning chamber body 610.

The FOUP cover 30 is fixedly supported by the FOUP cover supporting part 621 and the clamp 622 in the cleaning chamber cover 620. The FOUP body 20 is seated on the lifting part 634, the cleaning chamber cover 620 is moved downward by downward driving of the lifting driving part 631 to seal the upper portion of the cleaning chamber body 610, and in this process, the seating part 611 positioned at the lower portion in the cleaning chamber body 610 receives and seats the FOUP body 20 supported on the lifting part 634 thereon.

When the cleaning chamber 600 is sealed, an operation in which the FOUP body 20 and the FOUP cover 30 are cleaned is performed (S4). In the operation in which the FOUP body 20 and the FOUP cover 30 are cleaned, CDA may be mixed with steam and supplied into the cleaning chamber 600.

As an example, hot deionized water may be supplied to the outer surface of the FOUP body 20 and the FOUP cover 30, steam may be supplied to the inner surface of the FOUP body 20, and in this case, CDA may be mixed with the hot deionized water and the steam and supplied thereto.

As another embodiment, hot deionized water and steam may be selectively supplied to the outer surface of the body 20, the FOUP cover 30, and the inner surface of the FOUP cover 20, and in this case, CDA may also be mixed with the hot deionized water and the steam and supplied thereto.

When the operation in which the FOUP body 20 and the FOUP cover 30 are cleaned is performed, an operation in which the CDA is sprayed onto the FOUP body 20 and the FOUP cover 30 to dry the FOUP body 20 and the FOUP cover 30 is performed (S5). In this operation, ultraviolet rays may be emitted to the FOUP body 20 and the FOUP cover 30 so as to improve drying efficiency for the FOUP body 20 and the FOUP cover 30.

In the operations in which the FOUP body 20 and the FOUP cover 30 are cleaned and dried, the FOUP body 20 and the FOUP cover 30 may rotate by driving of the motors 670 and 623 to uniformly clean and dry the FOUP body 20 and the FOUP cover 30.

When the FOUP body 20 and the FOUP cover 30 are dried by supplying of the CDA, an operation in which the CDA is injected into the snorkel nozzle 21 provided in the FOUP body 20 to dry the snorkel nozzle 21 is performed (S6).

When the snorkel nozzle 21 is dried by the CDA, the cleaning chamber 600 is opened by upward driving of the lifting driving part 631, the FOUP body 20 is positioned at an upper portion in the cleaning chamber 600 by upward movement of the lifting part 634, and thus the FOUP body 20 and the FOUP cover 30 are allowed to be taken out of the cleaning chamber 600 to the outside.

Next, the FOUP body 20 and the FOUP cover 30 are transported to the vacuum chamber 700 by the robot 500 (S7). In a state in which the FOUP body 20 and the FOUP cover 30 are accommodated in the vacuum chamber body 710 at positions which are vertically separated from each other, nitrogen gas is supplied into the vacuum chamber body 710, and foreign matter containing moisture remaining on the vacuum chamber body 710 is simultaneously suctioned by a vacuum and discharged to the outside.

At the same time, an operation in which the nitrogen gas is injected into the snorkel nozzle 21 to redry the snorkel nozzle 21 is performed (S8).

When the snorkel nozzle 21 is dried by the nitrogen gas, operations in which the FOUR body 20 and the FOUP cover 30 are transported to the buffer 800 by the robot 500 to temporarily store the FOUP body 20 and the FOUP cover 30, and the FOUP 10 is sequentially transported to the standby part 300 and the loading and unloading part 200 and is unloaded are sequentially performed (S9, 810, and S11). In this case, when there is no preceding FOUP and the standby part 300 is empty, the FOUP body 20 and the FOUP cover 30 may be transported to the standby part 300 without being transported to the buffer 800 and be unloaded by the loading and unloading part 200.

According to a FOUP cleaning device and a FOUP cleaning method, since a FOUP body and a FOUP cover are cleaned using steam, high temperature bubbles and particles of water can thoroughly permeate a surface of the FOUP body and the FOUP cover to improve detergency and reduce a drying time, and thus cleaning and drying efficiency for the FOUP body and the FOUP cover can be improved.

In addition, since a mixed fluid, in which CDA is mixed with steam or hot deionized water for cleaning the FOUP body and the FOUP cover through a two-stream nozzle, is supplied, a spray pressure can be increased and detergency can be further improved due to a bubbling effect.

In addition, according to an embodiment in which cleaning is performed by supplying the hot deionized water to an external cleaning fluid spray part and cleaning is performed by supplying the steam to an internal cleaning fluid spray part, a capacity and a volume of a steam generator for generating the steam can be decreased and an inside of the FOUP body can also be effectively cleaned.

In addition, according to an embodiment in which the hot deionized water and the steam are selectively supplied through the external cleaning fluid spray part and the internal cleaning fluid spray part and the CDA is mixed and supplied to a flow path to which the hot deionized water and the steam are supplied using the common two-stream nozzle, since a common cleaning fluid supply line and the two-stream nozzle can be commonly used, a structure of the apparatus can be simplified.

In addition, since first drying is performed by injecting the CDA into the snorkel nozzle provided in the FOUP body which is cleaned in a cleaning chamber and second drying is performed by injecting nitrogen gas into the snorkel nozzle in a vacuum chamber, the snorkel nozzle formed of a foamed porous material can be dried in a short time period.

In addition, since a stopper configured to support one side surface of the FOUP body is provided to prevent the FOUP body from being pushed and moved in one direction due to a pressure according to supply of the CDA or nitrogen gas for drying the snorkel nozzle, a drying operation for the snorkel nozzle can be stably performed in a state in which the FOUP body is fixedly supported.

In addition, in cleaning and drying processes in the cleaning chamber, the FOUP body and the FOUP cover are rotated so that a cleaning fluid and the CDA are uniformly sprayed onto an entire region of the FOUP body and the FOUP cover, a plurality of nozzles configured to spray the cleaning fluid and the CDA are also formed to have different lengths and different spray angles so as to be positioned close to an outer surface of the FOUP body, and the plurality of nozzles are also obliquely formed to spray the cleaning fluid in a direction opposite to a direction in which the FOUP body is rotated, and thus cleaning and drying efficiency can be more improved.

In addition, since a cleaning chamber cover and a lifting part are formed to be vertically moved by driving of one lifting driving part, the FOUP body and the FOUP cover can be simply and smoothly put into or taken out of the cleaning chamber.

As described above, the present invention is not limited to the above-described embodiments and may be variously modified by those skilled in the art without departing from the scope of the present invention, and such modifications fall within the scope of the present invention.

What is claimed is:

1. A front opening unified pod (FOUP) cleaning device for cleaning a FOUP including a FOUP body and a FOUP cover, the FOUP cleaning device comprising:
 a loading and unloading part configured to load or unload the FOUP;
 a standby part which is provided at one side of the loading and unloading part and on which the FOUP body and the FOUP cover are separated from or coupled to each other;
 a cleaning chamber configured to clean the FOUP body and the FOUP cover using steam; and
 a robot configured to transport the FOUP body and the FOUP cover between the standby part and the cleaning chamber,
 wherein:
 the FOUP body includes a snorkel nozzle formed of a foamed porous material configured to purge an inside of the FOUP body;
 the cleaning chamber includes a compressed dry air supply part configured to inject compressed dry air into the snorkel nozzle after the FOUP body is cleaned; and
 the compressed dry air supply part is provided to be movable forward or backward to be connected to or disconnected from one side end of the snorkel nozzle.

2. The FOUP cleaning device of claim 1, wherein the steam is mixed with the compressed dry air.

3. The FOUP cleaning device of claim 1, wherein the cleaning chamber includes:

an external cleaning fluid spray part configured to spray a cleaning fluid onto an outer surface of the FOUP body and the FOUP cover; and an internal cleaning fluid spray part configured to spray the cleaning fluid onto an inner surface of the FOUP body.

4. The FOUP cleaning device of claim 3, wherein:
the cleaning fluid sprayed by the external cleaning fluid spray part includes hot deionized water; and
the cleaning fluid sprayed by the internal cleaning fluid spray part includes the steam.

5. The FOUP cleaning device of claim 4, wherein the hot deionized water and the steam are mixed with the compressed dry air.

6. The FOUP cleaning device of claim 3, wherein:
hot deionized water or the steam is mixed with the compressed dry air and selectively supplied through the external cleaning fluid spray part and the internal cleaning fluid spray part.

7. The FOUP cleaning device of claim 3, wherein a plurality of nozzles configured to spray the cleaning fluid and vertically separated are formed in the external cleaning fluid spray part,
wherein the plurality of nozzles are formed to have different lengths and different spray angles to be positioned close to the outer surface of the FOUP body.

8. The FOUP cleaning device of claim 7, wherein:
the FOUP body is rotatably provided in the cleaning chamber; and
the plurality of nozzles are obliquely formed to spray the cleaning fluid in a direction opposite to a direction in which the FOUP body rotates.

9. The FOUP cleaning device of claim 1, wherein the cleaning chamber includes the compressed dry air supply part configured to spray the compressed dry air to dry the FOUP body and the FOUP cover which are cleaned.

10. The FOUP cleaning device of claim 9, wherein the compressed dry air supply part includes:
an external air supply part configured to spray the compressed dry air onto an outer surface of the FOUP body; and
an internal air supply part configured to spray the compressed dry air onto an inner surface of the FOUP body.

11. The FOUP cleaning device of claim 10, wherein a plurality of nozzles configured to spray the compressed dry air and vertically separated are formed in the external air supply part,
wherein the plurality of nozzles are formed to have different lengths and different spray angles to be positioned close to the outer surface of the FOUP body.

12. The FOUP cleaning device of claim 11, wherein:
the FOUP body is rotatably provided in the cleaning chamber; and
the plurality of nozzles are obliquely formed to spray the compressed dry air in a direction opposite to a direction in which the FOUP body rotates.

13. The FOUP cleaning device of claim 10, wherein the compressed dry air supply part further includes an upper air supply part positioned between the FOUP body and the FOUP cover in the cleaning chamber and configured to spray the compressed dry air onto the FOUP body and the FOUP cover which are cleaned.

14. The FOUP cleaning device of claim 1, wherein the cleaning chamber includes a stopper provided to be movable forward or backward and configured to support one side surface of the FOUP body such that the FOUP body is not pushed and moved to one side by the compressed dry air sprayed by the compressed dry air supply part.

15. The FOUP cleaning device of claim 1, wherein the cleaning chamber includes:
a cleaning chamber body in which the FOUP body is accommodated and cleaned; and
a cleaning chamber cover which is configured to open or close an upper portion of the cleaning chamber body and in which the FOUP cover is supportedly cleaned.

16. The FOUP cleaning device of claim 15, wherein:
the cleaning chamber body includes a seating part provided at a lower portion of the cleaning chamber body to seat the FOUP body thereon and a lifting part vertically moved between the upper portion and the lower portion of the cleaning chamber body and configured to put the FOUP body onto the seating part or to receive the FOUP body from the seating part to vertically move the FOUP body;
the lifting part is connected to the cleaning chamber cover through a supporting part; and
both the lifting part and the cleaning chamber cover are vertically moved by one lifting driving part.

17. The FOUP cleaning device of claim 1, wherein the cleaning chamber includes ultraviolet lamps configured to emit ultraviolet rays which dry the FOUP body and the FOUP which are cleaned.

18. The FOUP cleaning device of claim 17, wherein the ultraviolet lamps include:
an external ultraviolet lamp configured to emit the ultraviolet rays onto an outer surface of the FOUP body; and
an internal ultraviolet lamp configured to emit the ultraviolet rays onto an inner surface of the FOUP body.

19. A front opening unified pod (FOUP) cleaning device for cleaning a FOUP including a FOUP body and a FOUP cover, the FOUP cleaning device comprising:
a loading and unloading part configured to load or unload the FOUP;
a standby part which is provided at one side of the loading and unloading part and on which the FOUP body and the FOUP cover are separated from or coupled to each other;
a cleaning chamber configured to clean the FOUP body and the FOUP cover using steam;
a robot configured to transport the FOUP body and the FOUP cover between the standby part and the cleaning chamber; and
a vacuum chamber into which the FOUP body and the FOUP cover, which are cleaned in the cleaning chamber, are transported by the robot,
wherein
the vacuum chamber is connected to a nitrogen gas supply line configured to supply nitrogen gas into the vacuum chamber and a vacuum line configured to suction a fluid in the vacuum chamber to discharge the fluid to an outside;
the FOUP body includes a snorkel nozzle formed of a foamed porous material configured to purge an inside of the FOUP body;
the vacuum chamber includes a nitrogen gas supply part configured to inject nitrogen gas into the snorkel nozzle; and
the nitrogen gas supply part is provided to be movable forward or backward to be connected to or disconnected from one side end of the snorkel nozzle.

20. The FOUP cleaning device of claim 19, wherein the vacuum chamber includes a stopper provided to be movable forward or backward and configured to support one side surface of the FOUP body such that the FOUP body is not pushed and moved to one side by the nitrogen gas sprayed by the nitrogen gas supply part.

21. The FOUP cleaning device of claim 19, wherein:
the vacuum chamber includes a vacuum chamber body, in which the FOUP body and the FOUP cover are accommodated in a state in which the FOUP body and the FOUP cover are separated; and
a vacuum chamber cover configured to vertically or laterally move to open or close an opening formed in one side surface of the vacuum chamber body.

22. The FOUP cleaning device of claim 19, further comprising a buffer in which the FOUP body and the FOUP cover are temporarily stored before being transported from the vacuum chamber in which the snorkel nozzle is dried to the standby part by the robot.

* * * * *